United States Patent
Huang et al.

(10) Patent No.: US 9,231,191 B2
(45) Date of Patent: Jan. 5, 2016

(54) MAGNETIC TUNNEL JUNCTION DEVICE AND METHOD OF MAKING SAME

(71) Applicant: Industrial Technology Research Institute, Chutung, Hsinchu (TW)

(72) Inventors: Sheng-Huang Huang, Tainan (TW); Kuei-Hung Shen, Hsinchu (TW); Yung-Hung Wang, Zhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 139 days.

(21) Appl. No.: 13/901,412

(22) Filed: May 23, 2013

(65) Prior Publication Data

US 2014/0048896 A1    Feb. 20, 2014

Related U.S. Application Data

(60) Provisional application No. 61/684,821, filed on Aug. 20, 2012, provisional application No. 61/735,149, filed on Dec. 10, 2012.

(51) Int. Cl.

| G11C 11/15 | (2006.01) |
|---|---|
| G01R 33/09 | (2006.01) |
| H01L 43/02 | (2006.01) |
| H01L 43/12 | (2006.01) |
| H01L 43/08 | (2006.01) |
| G11B 5/39 | (2006.01) |

(52) U.S. Cl.
CPC .............. *H01L 43/02* (2013.01); *G01R 33/091* (2013.01); *G01R 33/098* (2013.01); *G11C 11/15* (2013.01); *H01L 43/08* (2013.01); *H01L 43/12* (2013.01); *G11B 5/3909* (2013.01)

(58) Field of Classification Search
None
See application file for complete search history.

(56) References Cited

U.S. PATENT DOCUMENTS

| 7,948,044 | B2 | 5/2011 | Horng et al. |
|---|---|---|---|
| 8,057,925 | B2 | 11/2011 | Horng et al. |
| 8,164,947 | B2 | 4/2012 | Ranjan et al. |
| 2005/0041462 | A1 | 2/2005 | Kent et al. |
| 2009/0244792 | A1* | 10/2009 | Nakayama et al. ...... 360/324.11 |
| 2009/0256220 | A1 | 10/2009 | Horng et al. |
| 2010/0072524 | A1 | 3/2010 | Huai et al. |

(Continued)

FOREIGN PATENT DOCUMENTS

TW    201106351    2/2011

OTHER PUBLICATIONS

Meng at al., "Annealing Temperature Window for Tunneling Magnetoresistance and Spin Torque Switching in CoFeB/MgO/CoFeB Perpendicular Magnetic Tunnel Junctions", J. Appl. Phys. 110, 103915 (2011), pp. 103915-1-103915-5.

(Continued)

*Primary Examiner* — Kevin Bernatz
(74) *Attorney, Agent, or Firm* — Finnegan, Henderson, Farabow, Garrett & Dunner LLP

(57) ABSTRACT

A magnetic tunnel junction (MTJ) device includes a reference layer having a surface, a tunnel insulating layer formed over the surface of the reference layer, a free layer formed over the tunnel insulating layer, and a magnetic field providing layer formed over the free layer. A magnetization direction in each of the reference layer and the free layer is substantially perpendicular to the surface. The magnetic field providing layer is configured to provide a lateral magnetic field in the free layer, the lateral magnetic field being substantially parallel to the surface.

8 Claims, 15 Drawing Sheets

AP to P

P to AP

(56) References Cited

U.S. PATENT DOCUMENTS

| | | | |
|---|---|---|---|
| 2010/0140726 A1* | 6/2010 | Apalkov et al. | 257/421 |
| 2010/0271870 A1* | 10/2010 | Zheng et al. | 365/171 |
| 2011/0241139 A1* | 10/2011 | Yen et al. | 257/421 |
| 2012/0068281 A1* | 3/2012 | Saida et al. | 257/421 |
| 2012/0134201 A1* | 5/2012 | Ogimoto | 365/158 |
| 2013/0181305 A1* | 7/2013 | Nakayama et al. | 257/421 |
| 2013/0240963 A1* | 9/2013 | Beach et al. | 257/295 |
| 2014/0048895 A1* | 2/2014 | Huang et al. | 257/421 |
| 2014/0098443 A1* | 4/2014 | Davies | 360/324 |

OTHER PUBLICATIONS

Ikeda et al., "A Perpendicular-Anisotropy CoFeB-MgO Magnetic Tunnel Junction". Nature Materials, vol. 9, Sep. 2010, pp. 721-724.

Liu at al., "Ultrafast Switching in Magnetic Tunnel Junction Based Orthogonal Spin Transfer Devices", Appl. Phys. Lett. 97, 242510 (2010), pp. 242510-1-242510-3.

Gajek et al., "Spin Torque Switching of 20nm Magnetic Tunnel Junctions With Perpendicular Anisotropy", Appl. Phys. Lett. 100, 132408 (2012); pp. 132408-1-132408-3.

Chenchen et al., "Size Dependence Effect in MgO-Based CoFeB Tunnel Junctions With Perpendicular Magnetic Anisotropy", Japan Journal of Applied Physics 51 (2012), pp. 013101-1-013101-5.

Sato at al., "Junction Size Effect on Switching Current and Thermal Stability in CoFeB/MgO Perpendicular Magnetic Tunnel Junctions", Appl, Phys. Lett 99, 042501 (2011), pp. 042501-1-042501-3.

\* cited by examiner

AP to P

P to AP

MAGNETIC TUNNEL JUNCTION DEVICE AND METHOD OF MAKING SAME

CROSS-REFERENCE TO RELATED APPLICATIONS

This application is based upon and claims the benefit of priority from prior Provisional Application No. 61/684,821, filed Aug. 20, 2012, and prior Provisional Application No. 61/735,149, filed Dec. 10, 2012, the entire contents of both of which are incorporated herein by reference.

TECHNOLOGY FIELD

The disclosure relates to magnetic tunnel junction devices and, more particularly, to a perpendicular magnetized magnetic tunnel junction device.

BACKGROUND

Magnetic random access memory (MRAM) is a type of non-volatile random-access memory. An MRAM usually includes a magnetic tunnel junction (MTJ) structure including two magnetic layers separated by a thin tunnel insulating layer. The resistance of the MTJ structure depends on whether the magnetization directions in the two magnetic layers are the same or opposite to each other. Thus, the MTJ structure can switch between a low-resistance state and a high-resistance state depending on magnetization directions. The two different resistance states can be used to represent "0" and "1", respectively MRAM has a performance similar to that of static random-access memory (SRAM), a density similar to that of dynamic random-access memory (DRAM), but lower power consumption than DRAM. MRAM is faster and suffers no degradation over time in comparison to flash memory. Therefore, MRAM is considered a good candidate for replacing SRAM, DRAM, and flash memory.

An MRAM usually uses in-plane magnetic anisotropy (IMA) materials in the magnetic layers of the MTJ structure. In such an MTJ structure, the magnetization directions in the magnetic layers are parallel to a surface of the magnetic layers. When the device size is reduced, it may be difficult to achieve both a low write current and a thermal stability in an in-plane MTJ structure.

SUMMARY

In accordance with the disclosure, there is provided a magnetic tunnel junction (MTJ) device including a reference layer having a surface, a tunnel insulating layer formed over the surface of the reference layer, a free layer formed over the tunnel insulating layer, and a magnetic field providing layer formed over the free layer. A magnetization direction in each of the reference layer and the free layer is substantially perpendicular to the surface. The magnetic field providing layer is configured to provide a lateral magnetic field in the free layer, the lateral magnetic field being substantially parallel to the surface.

Also in accordance with the disclosure, there is provided an MTJ device including a reference layer having a surface, a tunnel insulating layer formed over the surface of the reference layer, a free layer formed over the tunnel insulating layer, and a magnetic field providing layer formed between the reference layer and the tunnel insulating layer. A magnetization direction in each of the reference layer and the free layer is substantially perpendicular to the surface. The magnetic field providing layer is configured to provide a lateral magnetic field in the free layer, the lateral magnetic field being substantially parallel to the surface.

Further in accordance with the disclosure, there is provided a method for forming an MTJ device, including forming a first ferromagnetic material layer over a substrate, forming a tunnel insulating material layer over the first ferromagnetic material layer, and forming a second ferromagnetic material layer over the tunnel insulating material layer. The method also includes forming a first etching mask over the second ferromagnetic material layer. The first etching mask covers a first portion of the second ferromagnetic material layer. The method further includes etching, using the first etching mask as a mask, the second ferromagnetic material layer, the tunnel insulating material layer, and the first ferromagnetic material layer, and forming a second etching mask over the second ferromagnetic material layer. The second etching mask covers a second portion of the second ferromagnetic material layer, where the second portion is smaller than the first portion. The method further includes etching, using the second etching mask as a mask, the second ferromagnetic material layer, the tunnel insulating material layer, and a portion of the first ferromagnetic material layer.

Further in accordance with the disclosure, there is provided an MTJ device including a reference layer having a surface, a tunnel insulating layer formed over the surface of the reference layer, a free layer formed over the tunnel insulating layer, and a lateral polarized current providing layer configured to provide a lateral polarized current in the free layer.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a magnetic tunnel junction device and a method of making a magnetic tunnel junction device.

Hereinafter, embodiments consistent with the disclosure will be described with reference to drawings. Wherever possible, the same reference numbers will be used throughout the drawings to refer to the same or like parts.

Figure 1A:
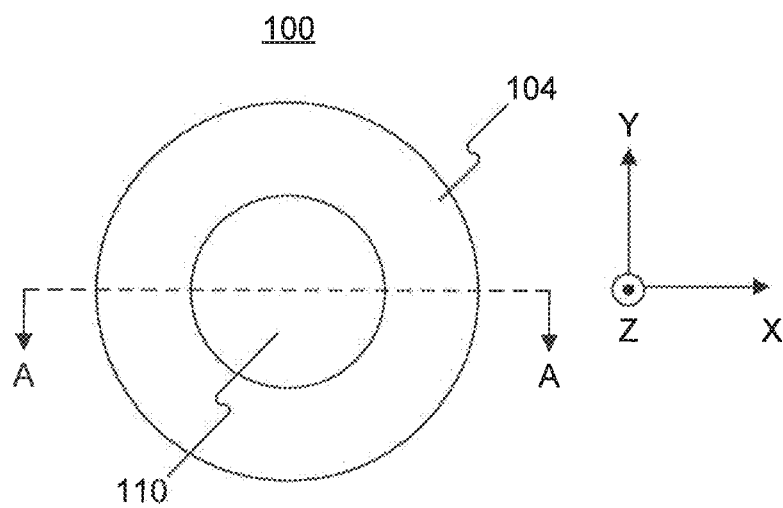
FIGS. 1(A) and 1(B) are a plan view and a cross-sectional view, respectively, schematically showing a magnetic tunnel junction (MTJ) device according to an exemplary embodiment.
Figure 1B:
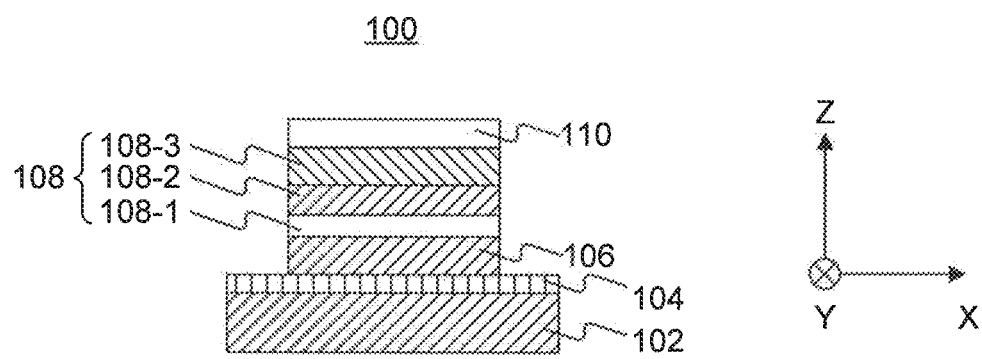

FIGS. 1(A) and 1(B) schematically show a magnetic tunnel junction (MTJ) device 100 consistent with embodiments of the disclosure. FIG. 1(A) is a plan view, and FIG. 1(B) is a cross-sectional view along line A-A shown in FIG. 1(A). As shown in FIG. 1(A), the MTJ device 100 has a circular cross-sectional shape in the plan view. However, the MTJ device 100 is not required to have a circular cross-sectional shape, but may have another shape, such as, for example, a triangular shape, a square shape, a diamond shape, a rectangular shape, a hexagonal shape, or an octagonal shape.

The MTJ device 100 includes a reference layer 102 having a surface, a tunnel insulating layer 104 formed over the surface of the reference layer 102, a free layer 106 formed over the tunnel insulating layer 104, and a magnetic field providing layer 108 formed over the free layer 106. The tunnel insulating layer 104 may be formed of a metal oxide, such as an aluminum oxide or a magnesium oxide. A thickness of the tunnel insulating layer 104 may be about 1 nm to about 3 nm. In some embodiments, a dimension of the tunnel insulating layer 104 in a horizontal direction, substantially parallel to the surface of the reference layer 102, is substantially the same as a dimension of the reference layer 102 in the horizontal direction (hereinafter, a dimension in the horizontal direction is referred to as a "horizontal dimension"). In the MTJ device 100 shown in FIG. 1(A), the horizontal dimension of a layer refers to the diameter of that layer. In other embodiments, the horizontal dimension of a layer may refer to another physical length, such as the length of a side if that layer has a triangular shape, a square shape, a diamond shape, a hexagonal shape, or an octagonal shape, or the length of a long side if that layer has a rectangular shape.

Consistent with embodiments of the disclosure, the horizontal dimension of the reference layer 102 is larger than the horizontal dimension of the free layer 106. In some embodiments, the horizontal dimension of the free layer 106 is about 10 nm to about 100 nm, and the horizontal dimension of the reference layer 102 is at least about 20 nm larger than the horizontal dimension of the free layer 106. In some embodiments, the horizontal dimension of the reference layer 102 may be about 20 nm to about 100 nm larger than the horizontal dimension of the free layer 106, or may be about 30 nm to about 60 nm larger than the horizontal dimension of the free layer 106.

The MTJ device 100 also includes a hard mask capping layer 110 formed over the magnetic field providing layer 108. The hard mask capping layer 110 is intended to protect the layers, such as the free layer 106 and the magnetic field providing layer 108, that are covered by the hard mask capping layer 110, from damage resulting from, e.g., etching. The hard mask capping layer 110 may be formed of, for example, tantalum (Ta). In some embodiments, a horizontal dimension of the hard mask capping layer 110 is substantially the same as a horizontal dimension of the free layer 106.

The MTJ device 100 further includes a first electrode (not shown) formed below the reference layer 102 and a second electrode (not shown) formed over the hard mask capping layer 110. The first and second electrodes may be formed of a metal, a metal alloy, or a metal nitride, such as Ta or TaN.

The reference layer 102 and the free layer 106 are each formed of a ferromagnetic material, and may include a single-layer film, a multilayer film, or laminated layers of different films. For example, the reference layer 102 may include a CoFeB single-layer film, a Co/Pt multilayer film, a Co/Pd multilayer film, a Co/Ni multilayer film, a CoPd alloy, or a FePt alloy, or a laminated layer including any combination thereof. A magnetization in the reference layer 102 may be adjusted by changing thicknesses of the layers in the reference layer 102, or by changing the number of the layers composing the reference layer 102, or both. In some embodiments, an interface of the reference layer 102 contacting the tunnel insulating layer 104 may be CoFeB, to achieve a high tunneling magnetoresistance (TMR) ratio. Similarly, the free layer 106 may include a CoFeB single-layer film, a Co/Pt multilayer film, a Co/Pd multilayer film, a Co/Ni multilayer film, a CoPd alloy, or a FePt alloy, or a laminated layer including any combination thereof. An interface of the free layer 106 contacting the tunnel insulating layer 104 may be CoFeB, to achieve a high TMR ratio.

Consistent with embodiments of the disclosure, in each of the reference layer 102 and the free layer 106, a magnetization direction is substantially perpendicular to the surface of the reference layer 102. Thus the MTJ device 100 is a perpendicular MTJ (p-MTJ) device. The magnetization direction in the reference layer 102 can be fixed and may point upward or downward. The magnetization direction in the free layer 106 is switchable, i.e., may be switched between pointing upward or downward. The magnetization direction in the free layer 106 may be switched by applying an external magnetic field or a spin-polarized current.

As shown in FIG. 1(B), the magnetic field providing layer 108 includes a spin valve structure. The magnetic field providing layer 108 includes an isolation spacer layer 108-1 formed over the free layer 106, a ferromagnetic layer 108-2 formed over the isolation spacer layer 108-1, and an antiferromagnetic layer 108-3 formed over the ferromagnetic layer 108-2.

Consistent with embodiments of the disclosure, the isolation spacer layer 108-1 may be formed of a non-magnetic material, such as, for example, Ru, Cu, Al, Mg, Ta, Ti, MgO, $AlO_x$, $TaO_x$, $TiO_x$, TaN, or TiN. The antiferromagnetic layer 108-3 serves to fix a magnetization direction in the ferromagnetic layer 108-2, and may be formed of, for example, PtMn or IrMn. While, as shown in FIG. 1(B), the antiferromagnetic layer 108-3 is formed over the ferromagnetic layer 108-2, in other embodiments, the antiferromagnetic layer 108-3 may be formed at another location. For example, the antiferromagnetic layer 108-3 may be formed between the isolation spacer layer 108-1 and the ferromagnetic layer 108-2.

Consistent with embodiments of the disclosure, the ferromagnetic layer 108-2 is formed of a ferromagnetic material, and may include a single-layer film, a multilayer film, or laminated layers of different films. For example, the ferromagnetic layer 108-2 may include a single-layer film including CoFeB, NiFe, CoFe, Co, Fe, or Ni, a Co/Pt multilayer film, a Co/Pd multilayer film, a Co/Ni multilayer film, a CoPd alloy, or a FePt alloy, or a laminated layer including any combination thereof. The magnetization direction in the ferromagnetic layer 108-2 is substantially parallel to the surface of the reference layer 102. That is, the magnetization direction in the ferromagnetic layer 108-2 is in the horizontal direction.

The ferromagnetic layer 108-2 generates a magnetic field in a space surrounding the ferromagnetic layer 108-2, including a lateral magnetic field in the free layer 106. The lateral magnetic field in the free layer 106 generated by the ferromagnetic layer 108-2 is a substantially uniform magnetic field. The lateral magnetic field in the free layer 106 generated by the ferromagnetic layer 108-2 increases the spin-transfer-torque (STT) switching efficiency in the free layer 106, thus, the time required for the perpendicular magnetization direction in the free layer 106 to switch from one direction, e.g., pointing upward, to another direction, e.g., pointing downward, can be reduced (hereinafter, such time is referred to as "switching time"). Consequently, a current required to achieve a certain switching time can be reduced. As a result, a write efficiency of the MTJ device 100 can be enhanced.

Figure 2:
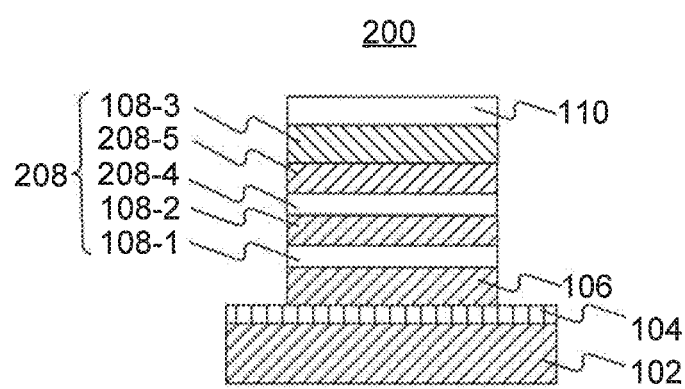
FIG. 2 is a cross-sectional view schematically showing an MTJ device according to another exemplary embodiment.

FIG. 2 is a cross-sectional view schematically showing another MTJ device 200 consistent with embodiments of the disclosure. The MTJ device 200 is similar to the MTJ device 100, except that the magnetic field providing layer 208 in the MTJ device 200 includes a synthetic antiferromagnetic (SAF) structure including two ferromagnetic layers sandwiching an isolation spacer layer. In addition to the isolation spacer layer 108-1, the ferromagnetic layer 108-2, and the antiferromagnetic layer 108-3, the magnetic field providing layer 208 further includes another isolation spacer layer 208-4 formed over the ferromagnetic layer 108-2 and another ferromagnetic layer 208-5 formed over the isolation spacer layer 208-4.

The isolation spacer layer 208-4 may be formed of, for example, Ru. The ferromagnetic layer 208-5 is formed of a ferromagnetic material, and may include a single-layer film, a multilayer film, or laminated layers of different films. For example, the ferromagnetic layer 208-5 may include a single-layer film including CoFeB, NiFe, CoFe, Co, Fe, or Ni, a Co/Pt multilayer film, a Co/Pd multilayer film, a Co/Ni multilayer film, a CoPd alloy, or a FePt alloy, or a laminated layer including any combination thereof. Similar to the ferromagnetic layer 108-2, the magnetization direction in the ferromagnetic layer 208-5 is also substantially parallel to the surface of the reference layer 102. However, the magnetization direction in the ferromagnetic layer 208-5 is substantially opposite to the magnetization direction in the ferromagnetic layer 108-2.

In order to provide a lateral magnetic field in the free layer 106, the amount of magnetization in the ferromagnetic layer 108-2 and that in the ferromagnetic layer 208-5 could be different from each other, so that the magnetic lines of the ferromagnetic layers 108-2 and 208-5 do not form a completely closed loop. As a consequence, a portion of the magnetic field generated by the ferromagnetic layers 108-2 and 208-5 extends to the free layer 106, forming the lateral magnetic field in the free layer 106. Different approaches may be adopted to realize different amounts of magnetization in the ferromagnetic layers 108-2 and 208-5. For example, the ferromagnetic layers 108-2 and 208-5 may be formed of different materials, or may have different thicknesses, or both.

In the MTJ device 200, the antiferromagnetic layer 108-3 is formed over the ferromagnetic layer 208-5. In other embodiments, the antiferromagnetic layer 108-3 may be formed at another location. For example, the antiferromagnetic layer 108-3 may be formed between the isolation spacer layer 108-1 and the ferromagnetic layer 108-2.

In the embodiments shown in FIGS. 1(A), 1(B), and 2, the lateral magnetic field in the free layer 106 is provided by a ferromagnetic layer having a horizontal magnetization direction. However, a lateral magnetic field in the free layer 106 can also be provided by a different type of ferromagnetic layer. For example, a ferromagnetic layer having a vertical magnetization direction, i.e., a magnetization direction substantially perpendicular to the surface of the reference layer 102, can generate a magnetic field in the space surrounding the ferromagnetic layer. Some magnetic lines of the generated magnetic field may bend and form closed loops with magnetic lines inside the ferromagnetic layer. Therefore, at some locations, the magnetic field generated by such a ferromagnetic layer having a vertical magnetization direction has a lateral component, which may affect the switching time of the free layer 106 if the free layer 106 overlaps these locations.

Figure 3A:
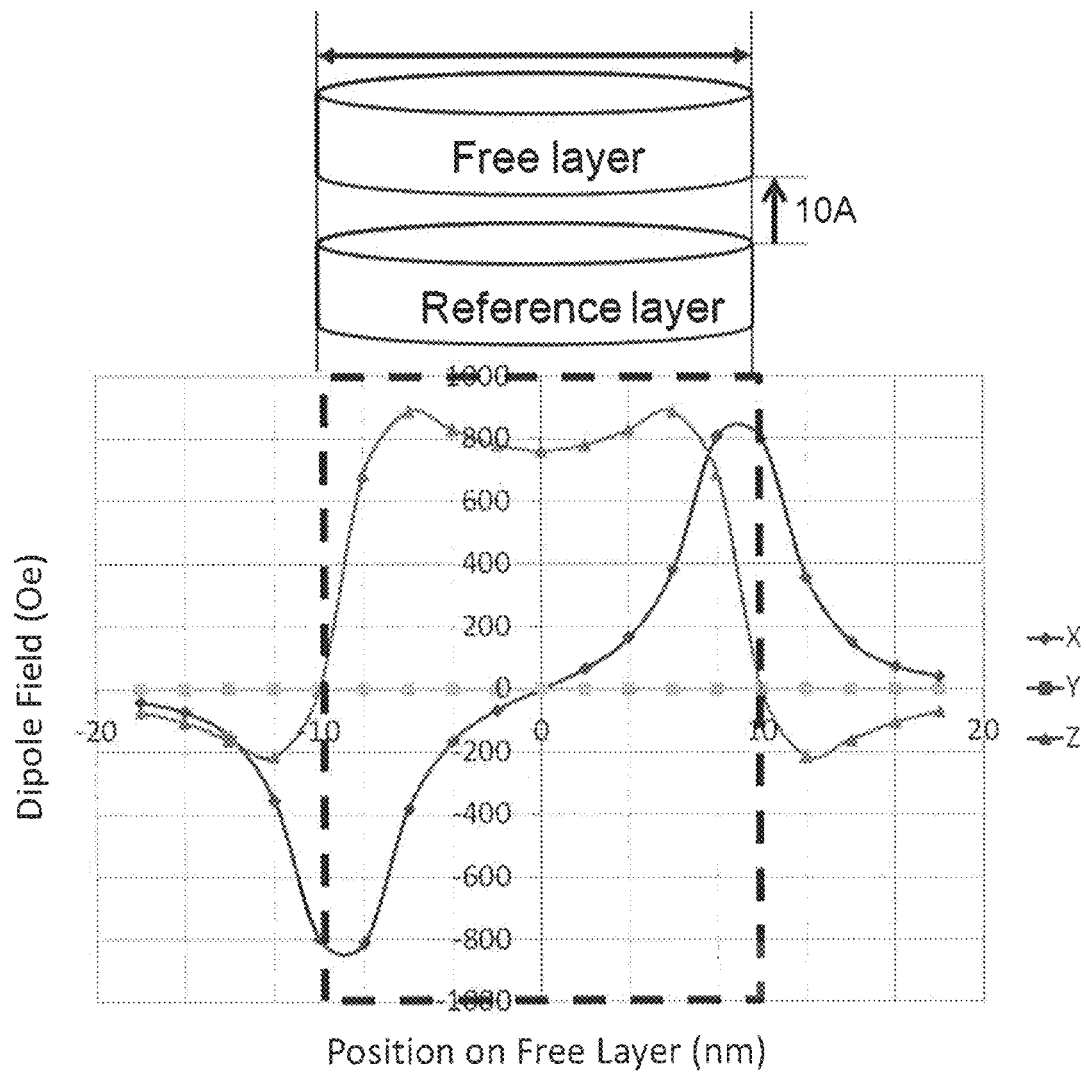
FIGS. 3(A) and 3(B) show simulation results of magnetic field distribution in a simplified structure including a reference layer and a free layer.

For example, FIG. 3(A) schematically shows a distribution of different components of a magnetic field, along a diameter direction of a circular-shape free layer, generated by a vertical-magnetization ferromagnetic layer placed beneath the circular-shaped free layer. In this example, the vertical-magnetization ferromagnetic layer has a same shape and same dimensions as the circular-shape free layer. The magnetic field generated by the vertical-magnetization ferromagnetic layer includes not only a vertical component $H_z$, but also lateral components including an X-component $H_x$ and a Y-component $H_y$ (in FIG. 3(A), $H_y$ appears to be zero because FIG. 3(A) shows the distribution along the diameter direction). In calculating the distribution shown in FIG. 3(A), the diameter of the circular-shape free layer (and thus the diameter of the vertical-magnetization ferromagnetic layer) is set to be 20 nm, a distance between the circular-shape free layer and the vertical-magnetization ferromagnetic layer is set to be 10 Å, and a saturation magnetization of the circular-shape free layer is set to be 1250 emu/cm$^3$.

Figure 3B:
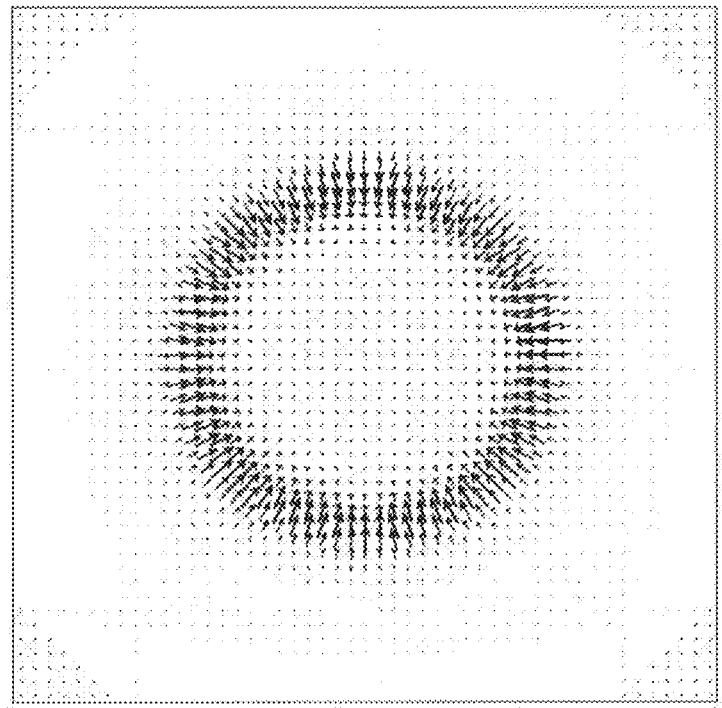

FIG. 3(B) visually illustrates the distribution of the lateral component of the magnetic field generated by the vertical-magnetization ferromagnetic layer in the circular-shape free layer. As shown in FIG. 3(B), this lateral component has a centripetal distribution, where each arrow in the figure represents the lateral component of the magnetic field at one point, with the direction of the arrow representing the direction of the lateral component of the magnetic field at that point and the length of the arrow representing the strength of the lateral component.

Figure 4A:
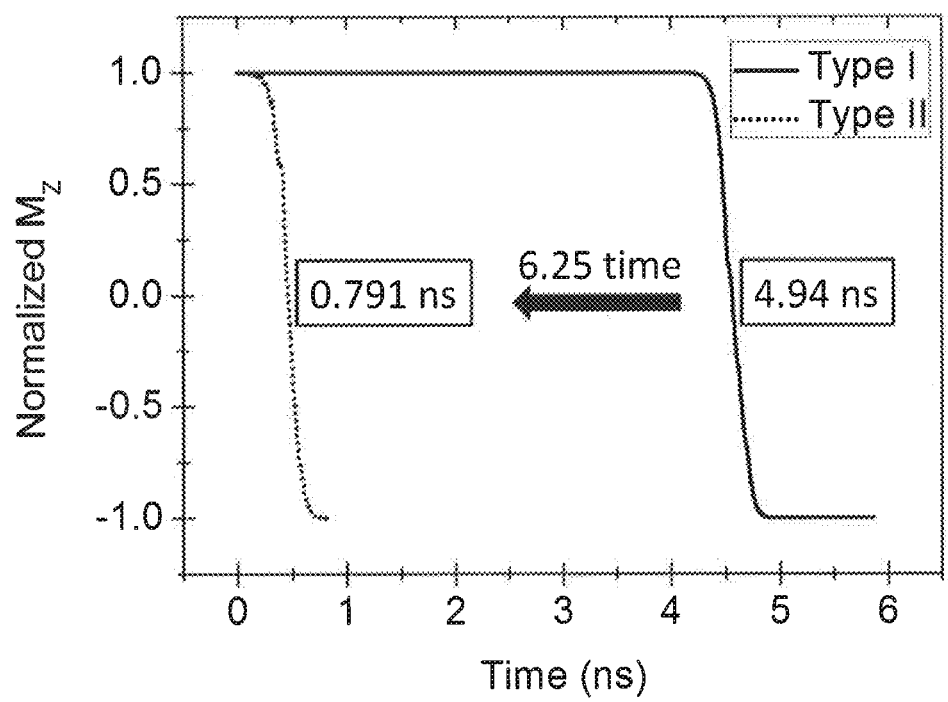
FIGS. 4(A) and 4(B) show simulation results schematically demonstrating the effect of a magnetic field having a lateral component on switching time of an MTJ device.
Figure 4B:
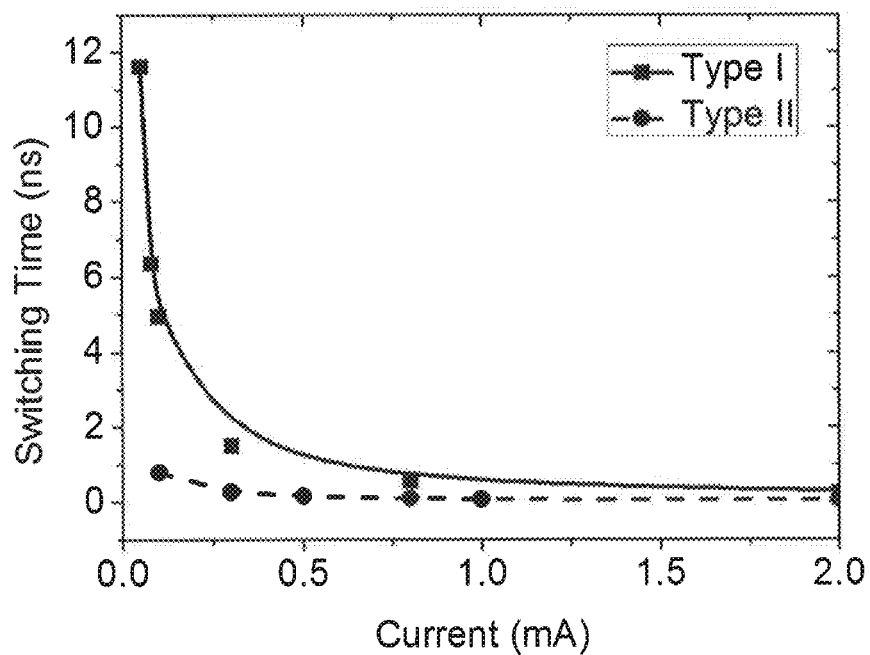

To illustrate the effect of a magnetic field having a lateral component on the switching time of a free layer, simulation was performed on two types of MTJ devices, i.e., a Type I MTJ device and a Type II MTJ device, and the simulation results are shown in FIGS. 4(A) and 4(B). In this simulation, a Type I MTJ device is an MTJ device in which the free layer is not affected by a lateral magnetic field, and a Type II MTJ device is an MTJ device in which the free layer is affected by a magnetic field having a distribution shown in FIGS. 3(A) and 3(B). FIG. 4(A) shows the switching time in each of the Type I and Type II MTJ devices when a current passing through each device is 0.1 mA. The ordinate in FIG. 4(A) represents the normalized magnetization in the vertical direction (Normalized $M_z$) of the free layer in an MTJ device. Normalized $M_z=1$ means the magnetization direction in the free layer points in a direction opposite to that in the reference layer of the MTJ device, and Normalized $M_z=-1$ means the magnetization direction in the free layer points in a direction the same as that in the reference layer. For example, if the magnetization direction in the reference layer points downward, then Normalized $M_z=1$ means the magnetization direction in the free layer points upward, and Normalized $M_z=-1$ means the magnetization direction points downward. As shown in FIG. 4(A), at a current of 0.1 mA, the switching time in the Type II MTJ device is about 6.25 times shorter than the switching time in the Type I MTJ device. FIG. 4(B) shows the switching time in each of the two types of MTJ devices at different currents (provided by, e.g., different voltages applied to the device). As shown in FIG. 4(B), the effect of the lateral magnetic field on the switching time is more significant at smaller current.

Figure 5:
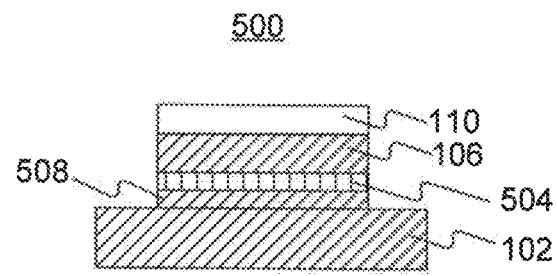
FIG. 5 is a cross-sectional view schematically showing an MTJ device according to another exemplary embodiment.

FIG. 5 is a cross-sectional view schematically showing another MTJ device 500 consistent with embodiments of the disclosure. The MTJ device 500 utilizes a ferromagnetic layer having a vertical magnetization direction to provide a magnetic field having a lateral component in the free layer. The MTJ device 500 is different from the MTJ device 100 in that the MTJ device 500 does not have the magnetic field providing layer 108 having a horizontal magnetization direction, but instead has a magnetic field providing layer 508 having a vertical magnetization direction. That is, the magnetization direction in the magnetic field providing layer 508 is substantially perpendicular to the surface of the reference layer 102. The magnetic field providing layer 508 is formed between the reference layer 102 and a tunnel insulating layer 504. The tunnel insulating layer 504 is similar to the tunnel insulating layer 104 of the MTJ device 100, except that the tunnel insulating layer 504 has a smaller horizontal dimension than the reference layer 102, as shown in FIG. 5.

In the MTJ device 500, horizontal dimensions of the magnetic field providing layer 508 and the tunnel insulating layer 504 are substantially the same as the horizontal dimension of the free layer 106, and are smaller than the horizontal dimension of the reference layer 102. The magnetic field in the free layer 106 generated by the magnetic field providing layer 508 includes a lateral component, which helps to reduce the switching time of the free layer 106.

In some embodiments, the magnetic field providing layer 508 may include a single-layer film, a multilayer film, or laminated layers of different films. For example, the magnetic field providing layer 508 may include a single-layer film including CoFeB, NiFe, CoFe, Co, Fe, or Ni, a Co/Pt multilayer film, a Co/Pd multilayer film, a Co/Ni multilayer film, a CoPd alloy, or a FePt alloy, or a laminated layer including any combination thereof. In some embodiments, the magnetic field providing layer 508 may be formed of a material different from that forming the reference layer 102. In other embodiments, the magnetic field providing layer 508 may be formed of a same material as the reference layer 102. In such embodiments, the magnetic field providing layer 508 may be formed by etching away a portion of the material layer used to form the reference layer 102. The process of fabricating an MTJ device 500, including such etching away, will be described later.

As discussed above, the horizontal component of the magnetic field generated by the magnetic field providing layer 508 in the free layer 106 helps to reduce the switching time of the free layer 106. However, if the magnetic field generated by the magnetic field providing layer 508 is too strong, for example, if the magnetic field providing layer 508 is too thick, the hysteresis loop of the MTJ device 500 may become asymmetric. Therefore, a thickness of the magnetic field providing layer 508 may need to be controlled, so that the magnetic field providing layer 508, on the one hand, helps to reduce the switching time of the free layer 106, and, on the other hand, does not introduce a large impact on the hysteresis loop of the MTJ device 500. In some embodiments, the thickness of the magnetic field providing layer 508 may be about ¼ to about ¹⁄₁₀ of a thickness of the reference layer 102.

Figure 6A:
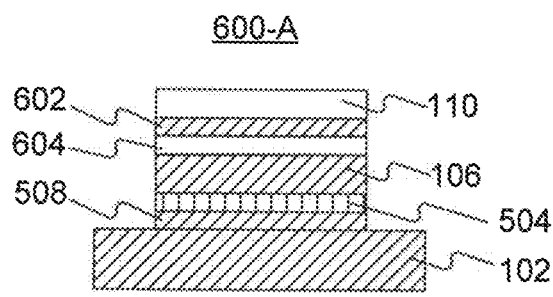
FIGS. 6(A) and 6(B) are a cross-sectional views schematically showing MTJ devices according to another exemplary embodiment.
Figure 6B:
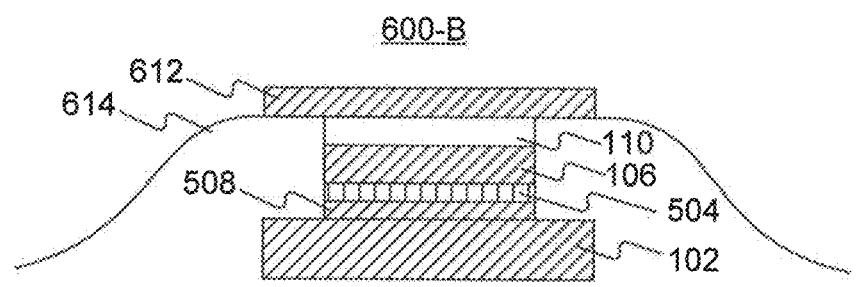
Figure 7:
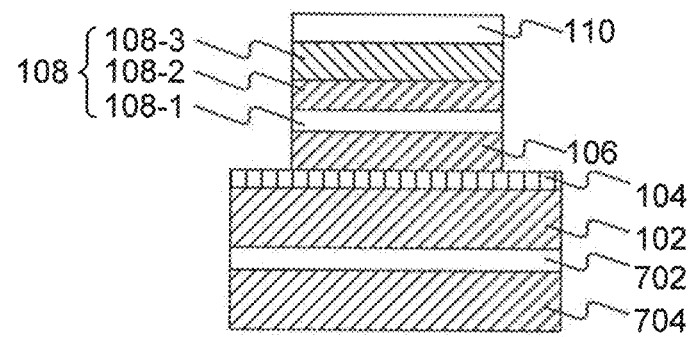
FIG. 7 is a cross-sectional view schematically showing an MTJ device according to another exemplary embodiment.
Figure 8:
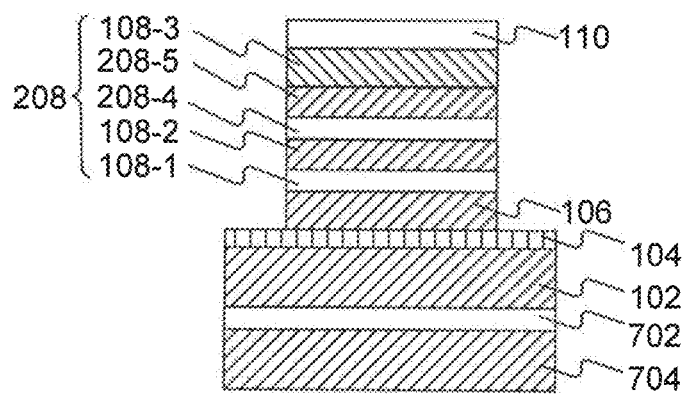
FIG. 8 is a cross-sectional view schematically showing an MTJ device according to another exemplary embodiment.
Figure 9:
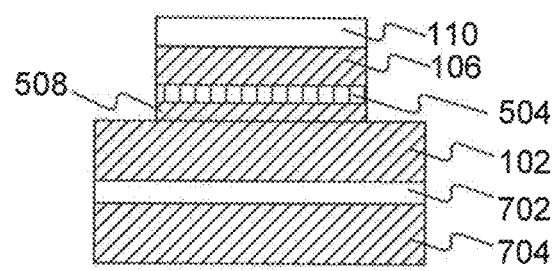
FIG. 9 is a cross-sectional view schematically showing an MTJ device according to another exemplary embodiment.

In the MTJ device 500, the magnetic field in the free layer 106 generated by the magnetic field providing layer 508 also has a vertical component, as can be schematically seen from the calculation results shown in FIG. 3(A). This vertical component may lead to a switching asymmetry, that is, the switching field for the MTJ device 500 to switch from an antiparallel status (i.e., the status in which the magnetization direction in the free layer 106 is substantially opposite to the magnetization direction in the reference layer 102) to a parallel status (i.e., the status in which the magnetization direction in the free layer 106 is substantially the same as the magnetization direction in the reference layer 102) may be different from the switching field for the MTJ device 500 to switch from a parallel status to an anti-parallel status. An additional ferromagnetic layer having a magnetization direction substantially opposite to the magnetization direction of the magnetic field providing layer 508 may be used to offset the vertical component of the magnetic field in the free layer 106 generated by the magnetic field providing layer 508. FIGS. 6(A) and 6(B) schematically show such MTJ devices 600-A and 600-B.

As shown in FIG. 6(A), the MTJ device 600-A is similar to the MTJ device 500, except that a magnetic capping layer 602 is formed between the free layer 106 and the hard mask capping layer 110. In some embodiments, the magnetic capping layer 602 may include a single-layer film, a multilayer film, or laminated layers of different films. For example, the magnetic capping layer 602 may include a single-layer film including CoFeB, NiFe, CoFe, Co, Fe, or Ni, a Co/Pt multilayer film, a Co/Pd multilayer film, a Co/Ni multilayer film, a CoPd alloy, or a FePt alloy, or a laminated layer including any combination thereof. A horizontal dimension of the magnetic capping layer 602 is substantially the same as the horizontal dimension of the free layer 106 (and thus substantially the same as the horizontal dimension of the magnetic field providing layer 508). The MTJ device 600-A also includes an isolation layer 604 formed between the free layer 106 and the magnetic capping layer 602 so that the free layer 106 and the magnetic capping layer 602 may not directly couple with each other.

The MTJ device 600-B shown in FIG. 6(B) also has a magnetic capping layer 612, which, however, is formed at a different position than the magnetic capping layer 602 in the MTJ device 600-A. As shown in FIG. 6(B), the magnetic capping layer 612 is formed over the hard mask capping layer 110. In some embodiments, the horizontal dimension of the reference layer 102 and a horizontal dimension of the magnetic capping layer 612 is the same. In other embodiments, the horizontal dimension of the magnetic capping layer 612 may be larger or smaller.

The MTJ device 600-B further includes an insulating spacer 614 formed to cover the layers in the MTJ device 600-B. In FIG. 6(B), the insulating spacer 614 covers all layers in the MTJ device 600-B except the magnetic capping layer 612. However, the insulating spacer 614 may cover less or more layers, for example, the insulating spacer 614 may also cover a portion of the magnetic capping layer 612.

The magnetic capping layer 602 or 612 is configured to offset the vertical component of the magnetic field in the free layer 106 generated by the magnetic field providing layer 508. A magnetization direction in the magnetic capping layer 602 or 612 is substantially opposite to the magnetization direction in the magnetic field providing layer 508. The amount of magnetization in the magnetic capping layer 602 or 612 may be adjusted by selecting a material forming the magnetic capping layer 602 or 612, by controlling a thickness of the magnetic capping layer 602 or 612, or by both selecting the material and controlling the thickness. As a result, the magnetic field providing layer 508 and the magnetic capping layer 602 or 612 together generate a magnetic field in the free layer 106 that may have substantially no vertical component but only a lateral component.

In the embodiments discussed above with reference to FIGS. 1(A), 1(B), 2, 5, 6(A) and 6(B), one reference layer 102 is formed in the MTJ device. However, in some embodiments, an additional reference layer may be formed below the reference layer 102 with a spacer layer formed therebetween. The reference layer 102, the spacer layer, and the additional reference layer together form an SAF structure having an antiparallel magnetization configuration.

FIGS. 7-10(B) schematically show MTJ devices having such an SAF structure formed below the free layer 106. MTJ devices 700, 800, 900, 1000-A, and 1000-B shown in FIGS. 7-10(B), respectively, are similar to the MTJ devices 100, 200, 500, 600-A, and 600-B, respectively, except that each of the MTJ devices 700, 800, 900, 1000 A, and 1000-B further includes a spacer layer 702 formed below the reference layer 102 and a lower reference layer 704 formed below the spacer layer 702. In some embodiments, the horizontal dimension of the reference layer 102, a horizontal dimension of the spacer layer 702, and a horizontal dimension of the lower reference layer 704 are the same.

The spacer layer 702 is formed of, for example, Ru. A thickness of the spacer layer 702 may be about 0.7 nm to about 1 nm.

Consistent with embodiments of the disclosure, the lower reference layer 704 is formed of a ferromagnetic material, and may include a single-layer film, a multilayer film, or laminated layers of different films. For example, the lower reference layer 704 may include a single-layer film including CoFeB, NiFe, CoFe, Co, Fe, or Ni, a Co/Pt multilayer film, a Co/Pd multilayer film, a Co/Ni multilayer film, a CoPd alloy, or a FePt alloy, or a laminated layer including any combination thereof.

A magnetization direction in the lower reference layer 704 is fixed and substantially perpendicular to the surface of the reference layer 102, and is substantially opposite to the magnetization direction in the reference layer 102. For example, in some embodiments, the magnetization direction in the reference layer 102 points upward, and the magnetization direction in the lower reference layer 704 points downward.

As discussed above, in the MTJ device 500, because of the magnetic field providing layer 508, the vertical component $H_z$ of the magnetic field in the free layer 106 is not zero. In the MTJ device 500, this vertical component $H_z$ may be adjusted by controlling the thickness or choosing the material (or both) of the magnetic field providing layer 508. In this situation, the adjusting of $H_z$ may be limited due to the need for $H_r$ to reduce the switching time of the MTJ device 500. However, in the MTJ device 900, the lower reference layer 704 adds an additional dimension for adjusting $H_z$ and $H_r$. By adjusting the total amount of magnetization in the magnetic field providing layer 508, the reference layer 102, and the lower reference layer 704, the vertical component $H_z$ may be controlled.

Figure 11:
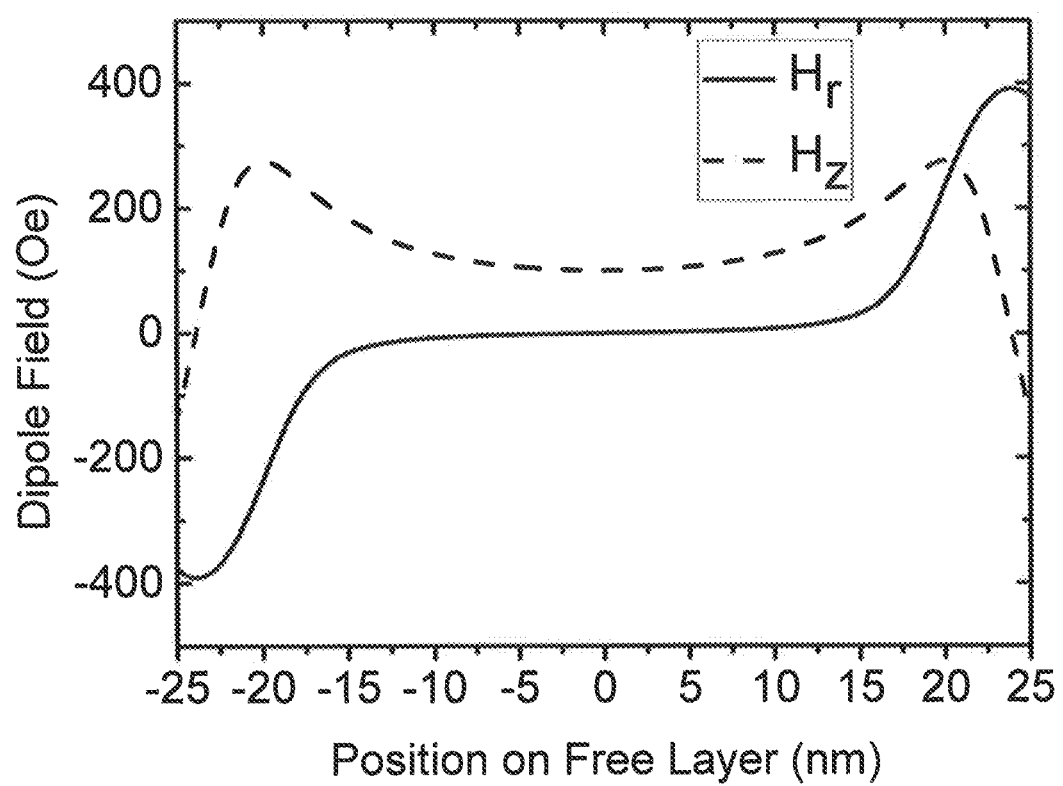
FIG. 11 shows results of simulation performed on the MTJ device shown in FIG. 9.

FIG. 11 shows results of a simulation performed on the MTJ device 900. FIG. 11 shows distributions of the vertical component $H_z$ and the lateral component $H_r$ of the magnetic field in the free layer 106 of the MTJ device 900. In this simulation, the diameter of the free layer 106 (and hence that of the magnetic field providing layer 508) was set to be 50 nm, the diameter of the reference layer 102 and that of the lower reference layer 704 were set to be 100 nm. The thickness of the magnetic field providing layer 508 was set to be ⅑ of thickness of the reference layer 102, and the thickness of the lower reference layer 704 was set to be the same as the total thickness of the magnetic field providing layer 508 and the reference layer 102. As shown in FIG. 11, a thin magnetic field providing layer 508 could provide a notable lateral magnetic field Hr in the free layer 106 of the MTJ device 900, and thus could enhance the STT switching efficiency in the free layer 106.

Figure 10A:
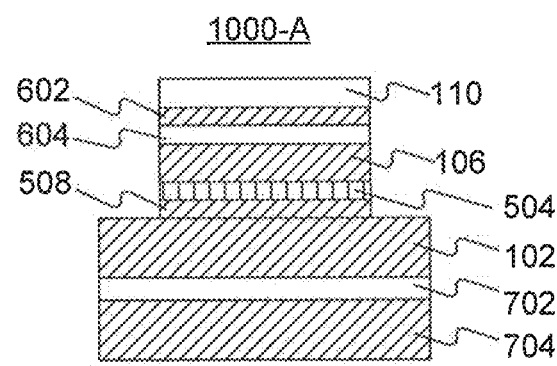
FIGS. 10(A) and 10(B) are a cross-sectional views schematically showing MTJ devices according to another exemplary embodiment.
Figure 10B:
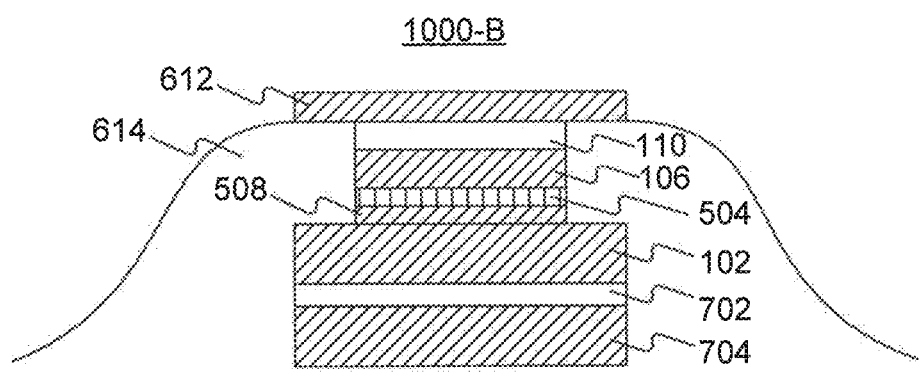
Figure 12:
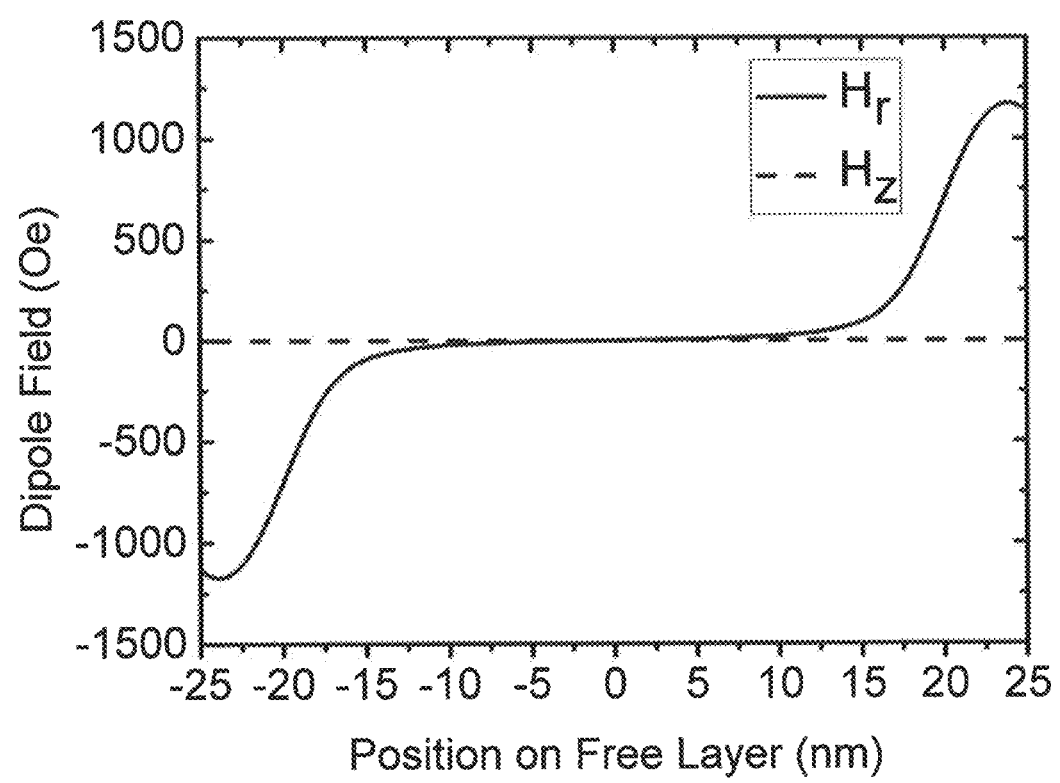
FIG. 12 shows results of simulation performed on the MTJ device shown in FIG. 10(A).

As discussed above, the vertical component $H_z$ of the magnetic field in the free layer 106 of a MTJ device created by the magnetic field providing layer 508 may be further offset or completely canceled by adding a magnetic capping layer, such as the magnetic capping layer 602 shown in FIGS. 6(A) and 10(A), or the magnetic capping layer 612 shown in FIGS. 6(B) and 10(B). FIG. 12 shows results of a simulation performed on the MTJ device 1000-A shown in FIG. 10(A). FIG. 12 shows distributions of the vertical component $H_z$ and the lateral component $H_r$ of the magnetic field in the free layer 106 of the MTJ device 1000-A. In this simulation, a saturation magnetization $M_s$ of the magnetic capping layer 602 is set to be 1600 eum/cm$^3$, and the thickness of the magnetic capping layer 602 is set to be the same as that of the magnetic field providing layer 508. As can be seen from FIG. 12, due to the existence of the magnetic capping layer 602, the vertical component $H_Z$ of the magnetic field in the free layer 106 is almost zero across the entire free layer 106.

To demonstrate the effect of the lateral magnetic field in the free layer 106 on the switching time of an MTJ device, simulation of the MTJ devices 700, 800, 900, 1000-A, and 1000-B was performed. MTJ devices 700, 800, 900, 1000-A, and 1000-B may be grouped into three categories. The first category includes MTJ devices 700 and 800, in which the lateral magnetic field in the free layer 106 is relatively uniform. The second category includes MTJ device 900, in which the lateral magnetic field in the free layer 106 is centripetal and there is vertical magnetic field in the free layer 106. The third category includes MTJ devices 1000-A and 1000-B, in which the lateral magnetic field in the free layer 106 is centripetal and there may be no vertical magnetic field in the free layer 106. To simplify discussion, it was assumed that the values of parameters for the simulation of the device in the first category (either MTJ device 700 or MTJ device 800) were set so that the lateral magnetic field in the free layer 106 was 500 Oe. For the simulation of the MTJ devices 900, 1000-A, and 1000-B, it was assumed that the magnetic field providing layer 508 is formed of the same material as the reference layer 102, and the thickness of the magnetic field providing layer 508 is ⅑ of the reference layer 102. Moreover, it was assumed that the values of parameters for the simulation of the device in the third category (either MTJ device 1000-A or MTJ device 1000-B) were set so that the vertical component of the magnetic field in the free layer 106 generated by the magnetic field providing layer 508 is completely offset by the magnetic capping layer 602 (if MTJ device 1000-A) or by the magnetic capping layer 612 (if MTJ device 1000-B).

Figure 13:
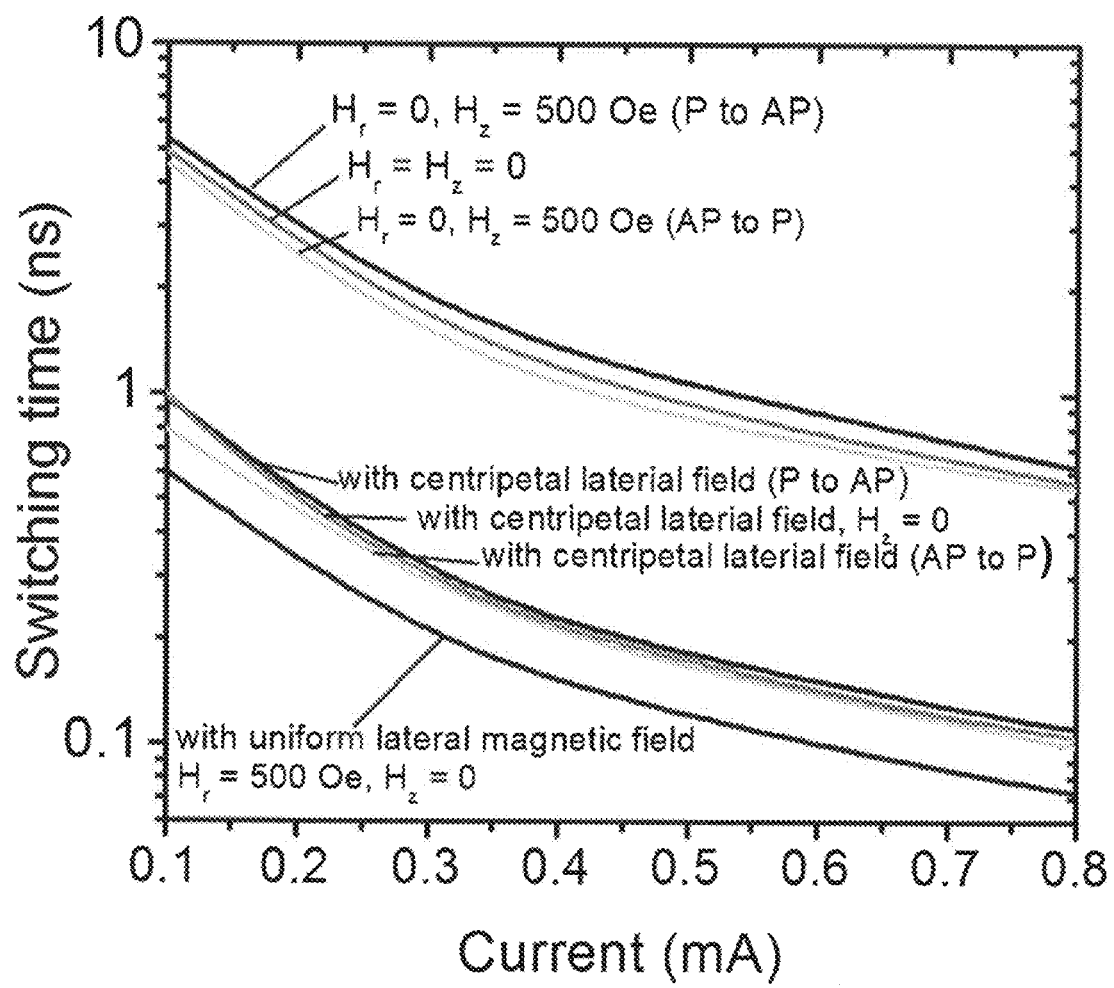
FIG. 13 show results of simulation of the MTJ devices shown in FIGS. 7, 8, 9, 10(A), and 10(B), and of comparison MTJ devices without lateral magnetic field in the free layer.

The simulation results are shown in FIG. 13. FIG. 13 shows the change of switching time with changing of current flowing in different MTJ devices. The current flowing in an MTJ device may be introduced by, e.g., a voltage applied across the MTJ device, such as across layers 110 and 704 in, e.g., MTJ device 700. In FIG. 13, the curve labeled as "with uniform lateral magnetic field" represents the switching time of an MTJ device in the first category (i.e., the MTJ device 700 or 800). In this simulation, the parameters of the MTJ device in the first category were set so that the lateral magnetic field was 500 Oe. The curve labeled as "with centripetal lateral magnetic field (AP to P)" and the curve labeled as "with centripetal lateral magnetic field (P to AP)" represent the switching time of an MTJ device in the second category (i.e., the MTJ device 900) when switching from the antiparallel status to the parallel status and when switching from the parallel status to the antiparallel status, respectively. The curve labeled as "with centripetal lateral magnetic field, $H_z=0$" represents the switching time of an MTJ device in the third category (i.e., the MTJ device 1000-A or 1000-B). As a comparison, the switching time of an MTJ device having neither lateral nor vertical magnetic field formed in the free layer (the curve labeled as "$H_r=H_z=0$") and the switching time of an MTJ device having no lateral magnetic field but having vertical magnetic field (i.e., $H_r=0$, $H_z\neq0$) in the free layer are also shown in FIG. 13 (in this simulation, the parameters were set so that the vertical magnetic field $H_z$ in the comparison case was 500 Oe). For the case where there is no lateral magnetic field but is vertical magnetic field in the free layer, both the switching time for switching from an antiparallel status to a parallel status (the curve labeled as "$H_r=0$, $H_z=500$ Oe (AP to P)" and the switching time for switching from the parallel status to the antiparallel status (the curve labeled as "$H_r=0$, $H_z=500$ Oe (P to AP)" are shown.

As shown in FIG. 13, due to the existence of the lateral magnetic field in the free layer, the switching time of each of the MTJ devices in the first to third categories is shorter than the switching time of an MTJ device having no lateral magnetic field formed in the free layer. In the MTJ device 900, since the magnetic field in the free layer 106 generated by the magnetic field providing layer 508 includes a vertical component, the time for switching from the antiparallel status to the parallel status is slightly different from the time for switching from the parallel status to the antiparallel status (this is similar to the situation in the MTJ device having no lateral magnetic field but having vertical magnetic field).

FIGS. 14(A)-14(H) schematically show an exemplary manufacturing process for making the MTJ device 500 shown in FIG. 5. In the exemplary manufacturing process, two etching processes, i.e., first and second etching processes, are performed to define the extent of the reference layer 102, and the extent of the magnetic field providing layer 508, the tunnel insulating layer 504, the free layer 106, and the hard mask capping layer 110, respectively.

Figure 14A:
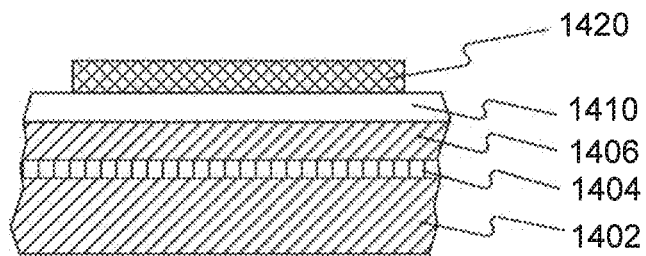
FIGS. 14(A)-14(H) schematically show a manufacturing process for making the MTJ device shown in FIG. 5.

As shown in FIG. 14(A), a first ferromagnetic material layer 1402, a tunnel insulating material layer 1404, a second ferromagnetic material layer 1406, and a hard mask material layer 1410 are formed over a substrate (not shown). The first etching process is performed to etch portions of the layers 1402, 1404, 1406, and 1410, to define the extent of the reference layer 102. In some embodiments, the first etching process may include several sub-etchings, such as a first sub-etching and a second sub-etching as described in detail below.

Figure 14B:
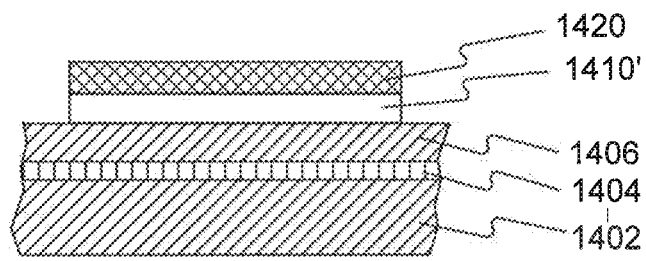
Figure 14C:
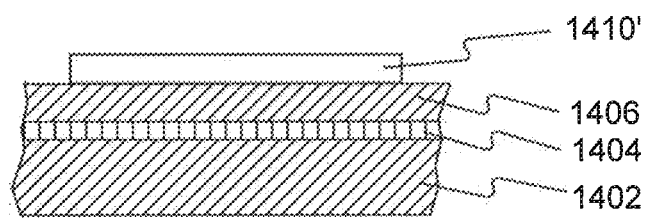
Figure 14D:
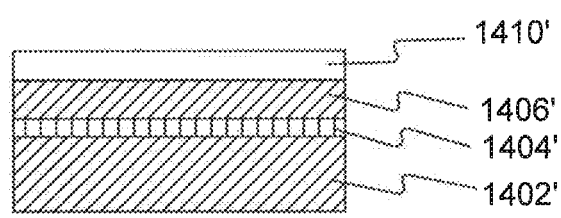

As shown in FIG. 14(A), a photo resist layer is formed over the hard mask material layer 1410 and patterned to form a first resist pattern 1420. The first resist pattern 1420 covers a region that corresponds to the reference layer 102. As shown in FIG. 14(B), the first sub-etching is performed, using the first resist pattern 1420 as a mask, to remove portions of the layer 1410 that are not covered by the first resist pattern 1420, forming a hard mask pattern 1410'. The first resist pattern 1420 is then removed to expose the hard mask pattern 1410', as shown in FIG. 14(C). Using the hard mask pattern 1410' as a mask, the second sub-etching is performed to remove portions of the layers 1402, 1404, and 1406 that are not covered by the hard mask pattern 1410'. The second sub-etching may be non-selective with respect to the layers 1402, 1404, and 1406, or may include a series of etchings each etching one or more layers of layers 1402, 1404, and 1406. In some embodiments, the second sub-etching may be an anisotropic etching. After the second sub-etching, the extent of the reference layer 102 is defined, and the un-etched portions of the layers 1402, 1404, and 1406 are designated as temporary pattern layers 1402', 1404', and 1406', respectively, as shown in FIG. 14(D).

The second etching process is performed to form the tunnel insulating layer 504, the free layer 106, and the hard mask capping layer 110. In addition, the second etching process also removes portions of a top part of the temporary pattern layer 1402' to form the magnetic field providing layer 508, and leave a bottom part of the temporary pattern layer 1402' as the reference layer 102. In some embodiments, the second etching process may also include several sub-etchings, such as a third sub-etching and a fourth sub-etching, as described in detail below.

Figure 14E:
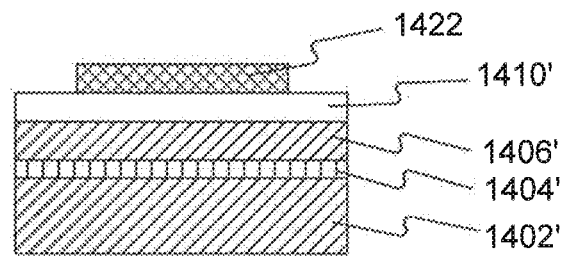
Figure 14F:
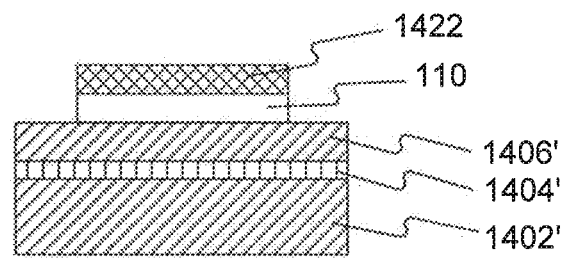
Figure 14G:
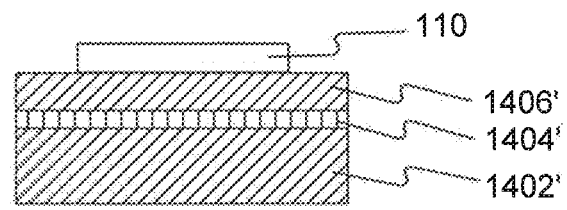

As shown in FIG. 14(E), another photo resist layer is formed over the hard mask pattern 1410' and patterned to form a second resist pattern 1422. The second resist pattern 1422 covers a region that corresponds to the free layer 106. As shown in FIG. 14(F), using the second resist pattern 1422 as a mask, a third sub-etching is performed to remove portions of the hard mask pattern 1410' that are not covered by the second resist pattern 1422, forming the hard mask capping layer 110. The second resist pattern 1422 is removed to expose the hard mask capping layer 110, as shown in FIG. 14(G). Using the hard mask capping layer 110 as a mask, a fourth sub-etching is performed to remove portions of the temporary pattern layers 1406' and 1404' that are not covered by the hard mask capping layer 110, forming the free layer 106 and the tunnel insulating layer 504. Moreover, the fourth sub-etching also removes portions of a top part of the temporary pattern layer 1402' that are not covered by the hard mask capping layer 110 to form the magnetic field providing layer 508. A bottom part of the temporary pattern layer 1402' is left un-etched as the reference layer 102, as shown in FIG. 14(H).

In some embodiments, an end point of the fourth sub-etching may be determined by controlling the amount of time for the fourth sub-etching, so as to control the thickness of the top part of the temporary pattern layer 1402' that is etched during the fourth sub-etching, which is also the thickness of the resulting magnetic field providing layer 508. In some embodiments, the thickness of the top part of the temporary pattern layer 1402' that is etched is about 1/10 of the thickness of the temporary pattern layer 1402'. That is, the thickness of the resulting magnetic field providing layer 508 is about 1/9 of the thickness of the reference layer 102.

Figure 14H:
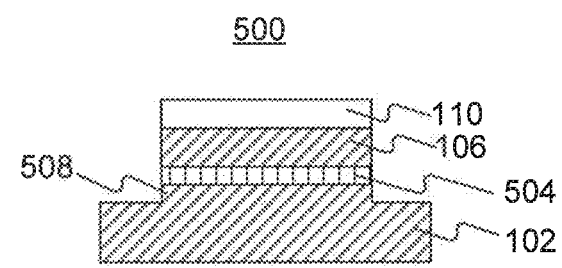

After the second etching process, all the layers in the MTJ device 500 are formed, as shown in FIG. 14(H).

In the embodiments described above, the switching time of an MTJ device is adjusted by providing a lateral magnetic field in the free layer using another magnetic layer. Therefore, the lateral magnetic field always exists in the free layer. Although this lateral magnetic field may help to reduce the switching time of the MTJ device, such a lateral magnetic field may also reduce the thermal stability of the MTJ device. Therefore, the present disclosure also provides another approach for reducing the switching time of an MTJ device without generating a lateral magnetic field in the free layer.

Figure 15:
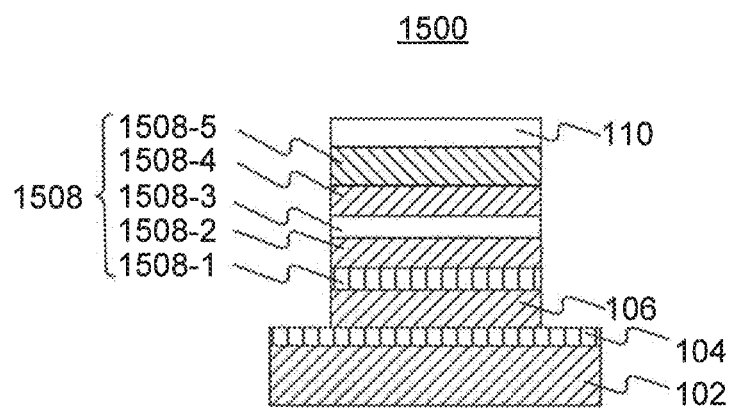
FIG. 15 is a cross-sectional view schematically showing an MTJ device according to a further exemplary embodiment.

FIG. 15 is a cross-sectional view showing an MTJ device 1500 consistent with embodiments of the present disclosure. The MTJ device 1500 is similar to the MTJ device 200 shown in FIG. 2, except that the magnetic field providing layer 208 in the MTJ device 200 is replaced by a lateral polarized current providing layer 1508. The lateral polarized current providing layer 1508 in the MTJ device 1500 also includes an SAF structure. The lateral polarized current providing layer 1508 includes a spin polarizer spacer layer 1508-1 formed over the free layer 106, a ferromagnetic layer 1508-2 formed over the spin polarizer spacer layer 1508-1, an isolation spacer layer 1508-3 formed over the ferromagnetic layer 1508-2, another ferromagnetic layer 1508-4 formed over the isolation spacer layer 1508-3, and an antiferromagnetic layer 1508-5 formed over the ferromagnetic layer 1508-4. Similar to the MTJ device 200, in the MTJ device 1500, the horizontal dimensions of the lateral polarized current providing layer 1508 and the hard mask capping layer 110 are substantially the same as the horizontal dimension of the free layer 106. The horizontal dimensions of the reference layer 102 and the tunnel insulating layer 104 are about at least 20 nm larger than the horizontal dimension of the free layer 106, In some embodiments, the spin polarizer spacer layer 1508-1 may be formed of a metal oxide, such as an aluminum oxide or a magnesium oxide, or a metal (spin filter) spacer, such as Cu. A thickness of the spin polarizer spacer layer 1508-1 may be about 0.5 nm to about 5 nm. The isolation spacer layer 1508-3 may be formed of a non-magnetism material, such as, for example, Ru. The antiferromagnetic layer 1508-5 serves to fix a magnetization direction in the ferromagnetic layer 1508-4, and may be formed of, for example, PtMn or IrMn.

The ferromagnetic layers 1508-2 and 1508-4 are each formed of a ferromagnetic material, and may each include a single-layer film, a multilayer film, or laminated layers of different films. For example, the ferromagnetic layers 1508-2 and 1508-4 may each include a single-layer film including CoFeB, NiFe, CoFe, Co, Fe, or Ni, a Co/Pt multilayer film, a Co/Pd multilayer film, a Co/Ni multilayer film, a CoPd alloy, or a FePt alloy, or a laminated layer including any combination thereof. The magnetization directions in the ferromagnetic layers 1508-2 and 1508-4 are substantially parallel to the surface of the reference layer 102 and substantially opposite directions to each other.

Consistent with embodiments of the disclosure, the amounts of magnetization in the ferromagnetic layers 1508-2 and 1508-4 are substantially the same as each other, so that the magnetic lines of the ferromagnetic layers 1508-2 and 1508-4 form a substantially closed loop. The ferromagnetic layers 1508-2 and 1508-4 may be formed of the same material or different materials. Further, the thicknesses of the ferromagnetic layers 1508-2 and 1508-4 may be the same as or different from each other.

Figure 16:
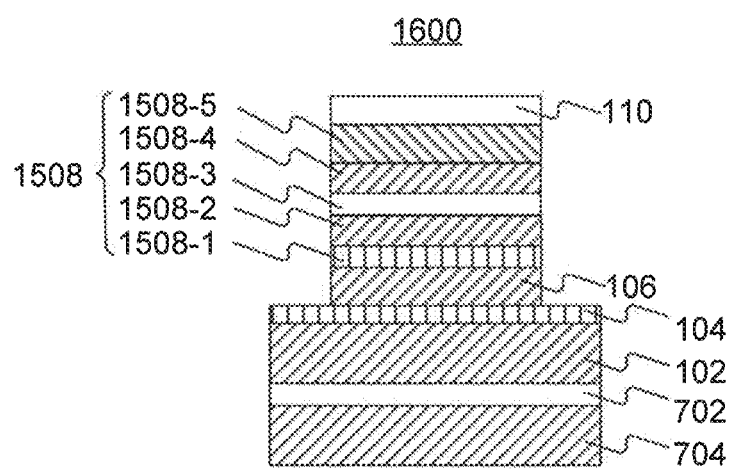
FIG. 16 is a cross-sectional view schematically showing an MTJ device according to a further exemplary embodiment.

FIG. 16 is a cross-sectional view showing an MTJ device 1600 consistent with embodiments of the disclosure. The MTJ device 1600 is similar to the MTJ device 1500, except that the MTJ device 1600 further includes a spacer layer 702 formed below the reference layer 102 and a lower reference layer 704 formed below the spacer layer 702.

Figure 17A:
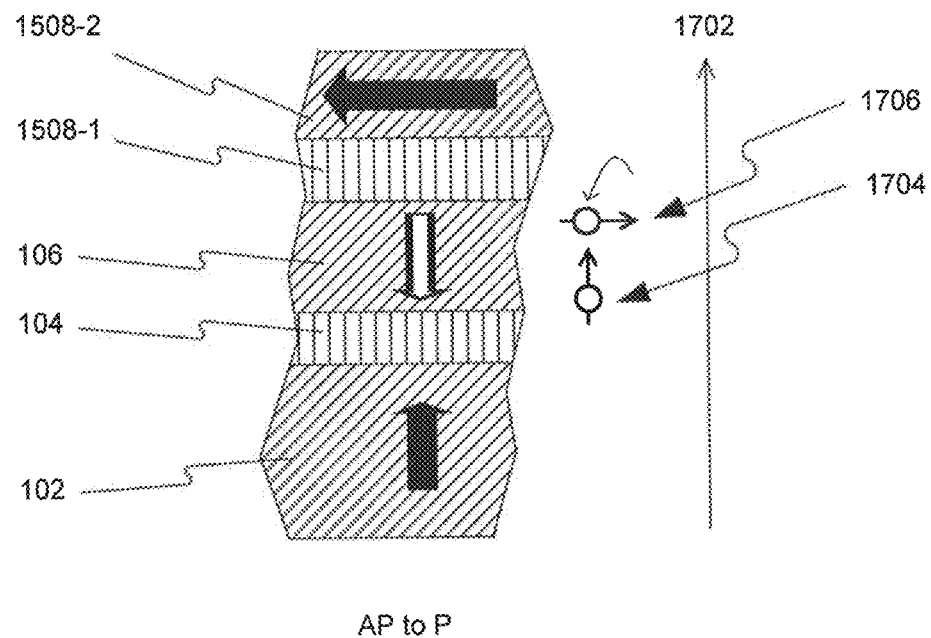
FIGS. 17(A) and 17(B) schematically explain a principal of operation of the MTJ device shown in FIG. 15 or 16.
Figure 17B:
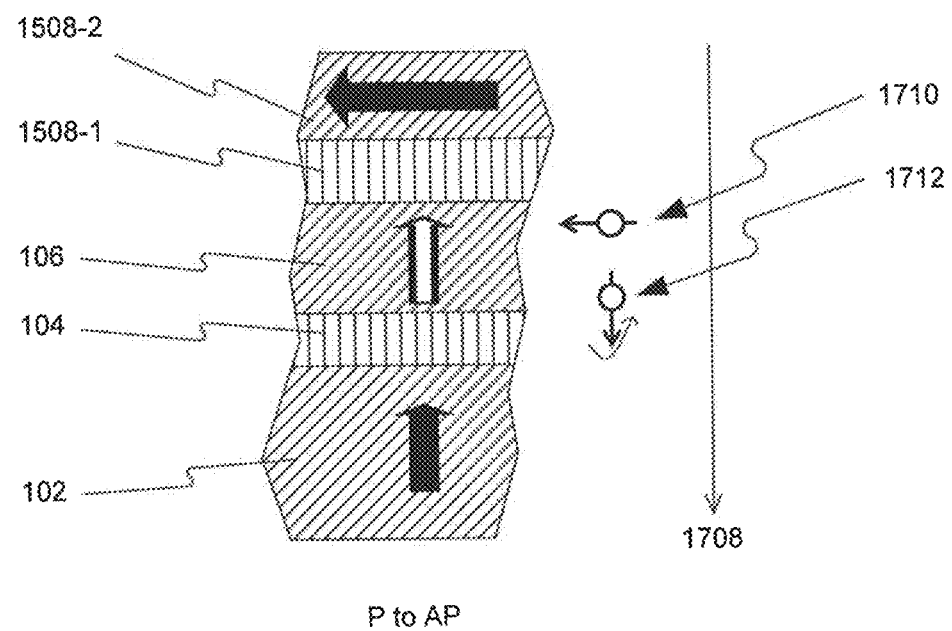

FIGS. 17(A) and 17(B) schematically illustrate how the lateral polarized current providing layer 1508 affects the switching efficiency (and thus the switching time) of the free layer 106. For simplicity, FIGS. 17(A) and 17(B) only show a portion of the reference layer 102, the tunnel insulating layer 104, the free layer 106, the spin polarizer spacer layer 1508-1, and the ferromagnetic layer 1508-2, instead of showing the entire MTJ device 1500 or 1600. FIGS. 17(A) and 17(B) show the situation of switching from the antiparallel status to the parallel status and the situation of switching from the parallel status to the antiparallel status, respectively.

As shown in FIG. 17(A), when switching from the antiparallel status to the parallel status, electrons move from the bottom to the top of the MTJ device 1500 or 1600, as indicated by arrow 1702. When electrons pass through the reference layer 102 (here assuming the magnetization direction in the reference layer 102 points upward, as shown in FIG. 17(A)), they are polarized by the reference layer 102 and the polarization direction of the electrons become the same as the magnetization direction in the reference layer 102, i.e., pointing upward. When the electrons reach the spin polarizer spacer layer 1508-1, some of the electrons are reflected back to the free layer 106. Before being reflected by the spin polarizer spacer layer 1508 1, the polarization direction of these electrons is changed by the ferromagnetic layer 1508-2 to point leftward (here assuming the magnetization direction in the ferromagnetic layer 1508-2 points leftward). After being reflected, the polarization direction of these reflected electrons flips, i.e., becomes pointing rightward. Therefore, two types of electrons exist in the free layer 106, one type being electrons 1704 coming from the reference layer 102 directly and having a polarization direction pointing upward, and the other type being electrons 1706 reflected by the spin polarizer spacer layer 1508-1 and having a polarization direction pointing rightward. The combination of these two polarization directions makes it easier for the magnetization direction in the free layer 106 to switch from pointing downward to pointing upward, i.e., the switching efficiency of the free layer 106 is increased, and thus the switching time of the free layer 106 is reduced.

Similarly, as shown in FIG. 17(B), when switching from the parallel status to the antiparallel status, electrons move from the top to the bottom of the MTJ device 1500 or 1600, as indicated by arrow 1708. When electrons pass through the ferromagnetic layer 1508-2 (here assuming the magnetization direction in the ferromagnetic layer 1508-2 points leftward, as shown in FIG. 17(B)), they are polarized by the ferromagnetic layer 1508-2 and the polarization direction of the electrons become the same as the magnetization direction in the ferromagnetic layer 1508-2, i.e., pointing leftward. When the electrons reach the tunnel insulating layer 104, some of the electrons are reflected back to the free layer 106. Before being reflected by the tunnel insulating layer 104, the polarization direction of these electrons is changed by the reference layer 102 to point upward (here assuming the magnetization direction in the reference layer 102 points upward). After being reflected, the polarization direction of these reflected electrons flips, i.e., becomes pointing downward. Therefore, two types of electrons exist in the free layer 106, one type being electrons 1710 coming from the ferromagnetic layer 1508-2 directly and having a polarization direction pointing leftward, and the other type being electrons 1712 reflected by the tunnel insulating layer 104 and having a polarization direction pointing downward. The combination of the two polarization directions makes it easier for the magnetization direction in the free layer 106 to switch from pointing upward to pointing downward.

Figure 18:
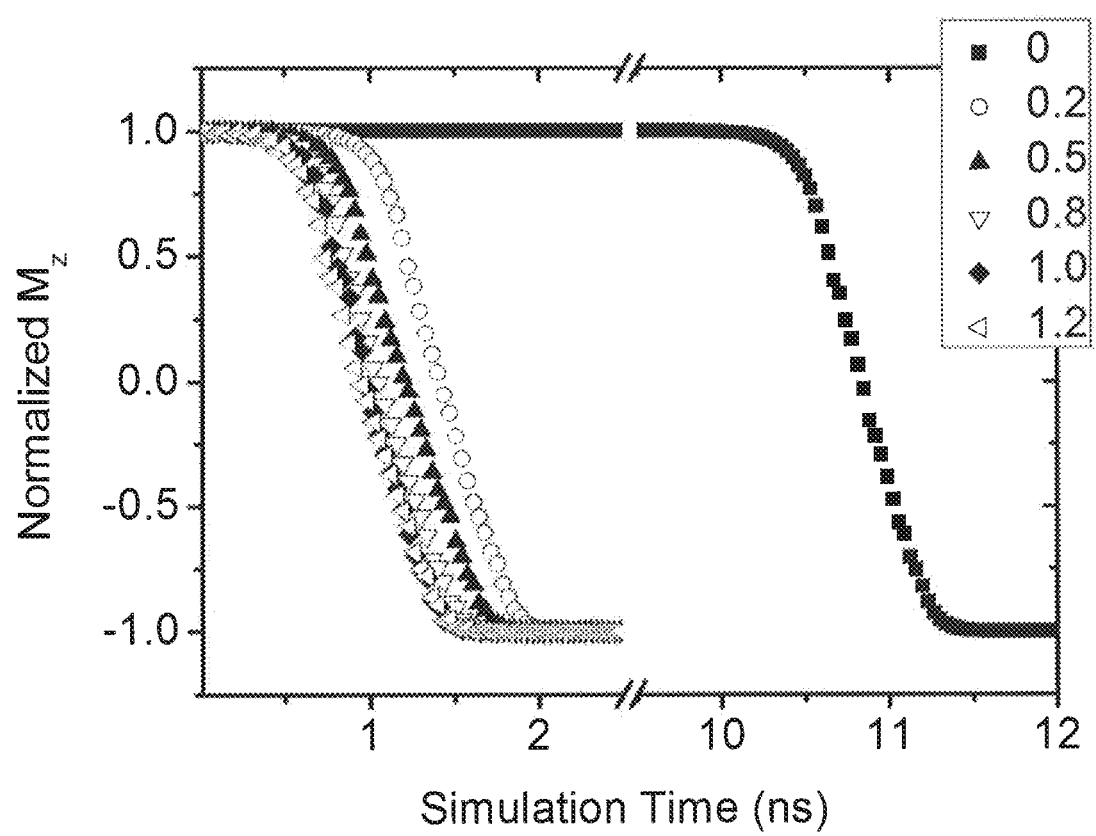
FIG. 18 shows results of simulation of the MTJ device shown in FIG. 16.

The effect of the lateral polarized current providing layer 1508 on the switching time of the free layer 106 may be impacted by the polarizabilities of the tunnel insulating layers 104 and spin polarizer spacer layers 1508-1. FIG. 18 schematically shows such an impact. In FIG. 18, the switching of the MTJ device 1600 between the different statuses (i.e., the normalized magnetization ($M_z$) in the free layer 106 changing from 1 to −1) when the polarizability of the spin polarizer spacer layer 1508-1 is 0, 0.2, 0.5, 0.8, 1.0, and 1.2 times of the polarizability of the tunnel insulating layer 104 is shown. In FIG. 18, the normalized magnetization ($M_z$) in the free layer 106 being "1" means the magnetization direction in the free layer 106 points in one direction (may be downward or upward, depending on whether the MTJ device 1600 is in an antiparallel status or a parallel status), and normalized $M_z$ being "−1" means the magnetization direction in the free layer 106 points in an opposite direction (may be upward or downward, respectively, depending on whether the MTJ device 1600 is changed to a parallel status or an antiparallel status) opposite to that one direction. It can be seen from FIG. 18 that the lateral polarized current providing layer 1508 can reduce the switching time even when the polarizability of the spin polarizer spacer layer 1508-1 is just 0.2 times of the polarizability of the tunnel insulating layer 104 (reducing from about 11 ns to about 2 ns).

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A magnetic tunnel junction (MTJ) device, comprising:
   a reference layer having a surface;
   a tunnel insulating layer formed over the surface of the reference layer;
   a free layer formed over the tunnel insulating layer, a magnetization direction in each of the reference layer and the free layer being substantially perpendicular to the surface; and
   a magnetic field providing layer formed over the free layer, configured to provide a lateral magnetic field in the free layer, the lateral magnetic field being substantially parallel to the surface, and the magnetic field providing layer including:
   an isolation spacer layer formed over the free layer:
   a ferromagnetic layer formed over the isolation spacer layer, a magnetization direction in the ferromagnetic layer being substantially parallel to the surface; and
   an antiferromagnetic layer formed between the isolation spacer layer and the ferromagnetic layer.

2. The MTJ device of claim 1, wherein:
   the reference layer includes one of a CoFeB single-layer film, a Co/Pt multilayer film, a Co/Pd multilayer film, a Co/Ni multilayer film, a CoPd alloy, or a FePt alloy, or a laminated layer including any combination thereof, and
   the free layer includes one of a CoFeB single-layer film, a Co/Pt multilayer film, a Co/Pd multilayer film, a Co/Ni multilayer film, a CoPd alloy, or a FePt alloy, or a laminated layer including any combination thereof.

3. The MTJ device of claim 1, wherein the ferromagnetic layer includes one of a single-layer film including CoFeB, NiFe, CoFe, Co, Fe, or Ni, a Co/Pt multilayer film, a Co/Pd multilayer film, a Co/Ni multilayer film, a CoPd alloy, or a FePt alloy, or a laminated layer including any combination thereof.

4. The MTJ device of claim 1, wherein the antiferromagnetic layer includes one of PtMn or IrMn.

5. The MTJ device of claim 1, wherein:
   the isolation spacer layer is a first isolation spacer layer,
   the ferromagnetic layer is a first ferromagnetic layer, and
   the magnetic field providing layer further comprises:
      a second isolation spacer layer formed over the first ferromagnetic layer; and
      a second ferromagnetic layer formed over the second isolation spacer layer.

6. The MTJ device of claim 1, wherein a dimension of the reference layer in a horizontal direction substantially parallel to the surface is larger than a dimension of the free layer in the horizontal direction.

7. The MTJ device of claim 1, further comprising:
   a spacer layer formed below the reference layer; and
   a lower reference layer formed below the spacer layer, a magnetization direction in the lower reference layer being substantially perpendicular to the surface and substantially opposite to the magnetization direction in the reference layer.

8. The MTJ device of claim 1, further comprising:
   a hard mask capping layer formed over the magnetic field providing layer.

* * * * *